United States Patent
Liao et al.

(10) Patent No.: US 12,027,350 B2
(45) Date of Patent: Jul. 2, 2024

(54) PROCESS AND RELATED DEVICE FOR REMOVING BY-PRODUCT ON SEMICONDUCTOR PROCESSING CHAMBER SIDEWALLS

(71) Applicant: Taiwan Semiconductor Manufacturing Company, Ltd., Hsinchu (TW)

(72) Inventors: Jing-Cheng Liao, Keelung (TW); Chang-Ming Wu, New Taipei (TW); Lee-Chuan Tseng, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 490 days.

(21) Appl. No.: 17/004,432

(22) Filed: Aug. 27, 2020

(65) Prior Publication Data
US 2020/0395200 A1    Dec. 17, 2020

Related U.S. Application Data

(63) Continuation of application No. 15/927,308, filed on Mar. 21, 2018, now Pat. No. 10,784,091.

(Continued)

(51) Int. Cl.
*H01L 21/02* (2006.01)
*C23C 16/44* (2006.01)
(Continued)

(52) U.S. Cl.
CPC .... *H01J 37/32862* (2013.01); *C23C 16/4405* (2013.01); *H01J 37/3244* (2013.01);
(Continued)

(58) Field of Classification Search
CPC ............. H01J 37/32862; H01J 37/3244; H01J 2237/334; H01J 2237/335;
(Continued)

(56) References Cited

U.S. PATENT DOCUMENTS 5,269,881 A    12/1993    Sekiya et al.
9,595,448 B2    3/2017    Hong et al.
(Continued)

FOREIGN PATENT DOCUMENTS

JP    08022980 A    1/1996
JP    2002057110 A    2/2002
(Continued)

OTHER PUBLICATIONS

K. Nojiri. "Dry Etching Technology for Semiconductors." Springer International Publishing Switzerland 2015 DOI 10.1007/978-3-319-10295-5_2. Published in 2015.
(Continued)

*Primary Examiner* — Alexander Markoff
(74) *Attorney, Agent, or Firm* — Eschweiler & Potashnik, LLC

(57) ABSTRACT

In some embodiments, a method for cleaning a processing chamber is provided. The method may be performed by introducing a processing gas into a processing chamber that has a by-product disposed along sidewalls of the processing chamber. A plasma is generated from the processing gas using a radio frequency signal. A lower electrode is connected to a first electric potential. Concurrently, a bias voltage having a second electric potential is applied to a sidewall electrode to induce ion bombardment of the by-product, in which the second electric potential has a larger magnitude than the first electric potential. The processing gas is evacuated from the processing chamber.

20 Claims, 12 Drawing Sheets

Related U.S. Application Data

(60) Provisional application No. 62/565,673, filed on Sep. 29, 2017.

(51) Int. Cl.
  *H01J 37/32* (2006.01)
  *H01L 21/3065* (2006.01)
  *H01L 21/3213* (2006.01)
  *H01L 21/683* (2006.01)

(52) U.S. Cl.
  CPC .... *H01L 21/02271* (2013.01); *H01L 21/3065* (2013.01); *H01L 21/32136* (2013.01); *H01J 2237/334* (2013.01); *H01J 2237/335* (2013.01); *H01L 21/6831* (2013.01)

(58) Field of Classification Search
  CPC .......... H01J 37/32082; C23C 16/4405; H01L 21/02271; H01L 21/3065; H01L 21/32136; H01L 21/6831; H01L 21/67011
  See application file for complete search history.

(56) References Cited

U.S. PATENT DOCUMENTS

| | | | |
|---|---|---|---|
| 10,784,091 B2* | 9/2020 | Liao | H01L 21/02271 |
| 11,905,596 B2* | 2/2024 | Yoshino | C23C 16/52 |
| 2002/0092826 A1 | 7/2002 | Ding | |
| 2004/0016508 A1 | 1/2004 | Masuda et al. | |
| 2004/0045675 A1 | 3/2004 | Masuda et al. | |
| 2005/0022740 A1 | 2/2005 | Hatano | |
| 2005/0236109 A1 | 10/2005 | Masuda et al. | |
| 2006/0201533 A1 | 9/2006 | Wani et al. | |
| 2006/0219363 A1 | 10/2006 | Matsumoto et al. | |
| 2007/0020941 A1 | 1/2007 | Tamura et al. | |
| 2007/0210032 A1 | 9/2007 | Nishio | |
| 2007/0221331 A1 | 9/2007 | Lee | |
| 2008/0314522 A1 | 12/2008 | Bera et al. | |
| 2009/0035941 A1 | 2/2009 | Park et al. | |
| 2010/0078312 A1 | 4/2010 | Mullapudi et al. | |
| 2011/0045615 A1 | 2/2011 | Omura | |
| 2011/0240599 A1 | 10/2011 | Honda | |
| 2011/0297533 A1 | 12/2011 | Mori et al. | |
| 2012/0145184 A1 | 6/2012 | Kitazoe et al. | |
| 2013/0276984 A1 | 10/2013 | Papa et al. | |
| 2014/0116621 A1 | 5/2014 | Mori et al. | |
| 2015/0200081 A1* | 7/2015 | Nakayama | H01J 37/3405 134/1.1 |
| 2015/0247235 A1 | 9/2015 | Kishi et al. | |
| 2015/0348763 A1 | 12/2015 | Mori et al. | |
| 2016/0181067 A1 | 6/2016 | Singh et al. | |
| 2016/0358755 A1 | 12/2016 | Long et al. | |
| 2016/0372307 A1 | 12/2016 | Yang et al. | |
| 2017/0040176 A1 | 2/2017 | Long et al. | |
| 2017/0253974 A1 | 9/2017 | Canniff | |
| 2017/0278665 A1 | 9/2017 | Carter et al. | |
| 2017/0365450 A1* | 12/2017 | Bi | H01J 37/32862 |
| 2017/0372912 A1 | 12/2017 | Long et al. | |
| 2019/0032217 A1* | 1/2019 | Yoshino | H01L 21/02274 |

FOREIGN PATENT DOCUMENTS

| | | |
|---|---|---|
| JP | 2007214512 A | 8/2007 |
| WO | 2007214512 A1 | 2/2011 |

OTHER PUBLICATIONS

Chen, Francis. "Advanced Plasma Technology." Chapter 6, Radiofrequency Plasma Sources for Semiconductor Processing. Copyright 2007 Wiley-VCH Verlag Gmbh & Co. KGaA, Weinheim ISBN: 978-3-527-40591-6. Published in 2007.

Sheam, et al. "Semiconductor Technologies." Chapter 5, Advanced Plasma Processing: Etching, Deposition, and Wafer Bonding Techniques for Semiconductor Applications. Published in 2010.

Non-Final Office Action dated Sep. 3, 2019 for U.S. Appl. No. 15/927,308.

Final Office Action dated Feb. 20, 2020 for U.S. Appl. No. 15/927,308.

Notice of Allowance dated May 18, 2020 for U.S. Appl. No. 15/927,308.

* cited by examiner

PROCESS AND RELATED DEVICE FOR REMOVING BY-PRODUCT ON SEMICONDUCTOR PROCESSING CHAMBER SIDEWALLS

REFERENCE TO RELATED APPLICATION

This Application is a Continuation of U.S. application Ser. No. 15/927,308, filed on Mar. 21, 2018, which claims the benefit of U.S. Provisional Application No. 62/565,673, filed on Sep. 29, 2017. The contents of the above referenced Patent Applications are hereby incorporated by reference in their entirety.

BACKGROUND

Semiconductor processing equipment, such as plasma-enhanced chemical vapor deposition (PE-CVD) systems, plasma etching systems, and sputtering systems, are used extensively throughout the production of modern day electronic devices. This semiconductor processing equipment may contain a processing chamber that helps contain the often reactive processes performed by this equipment. Due to these processes, by-products may form on a sidewall of the processing chamber resulting in decreased performance and/or contamination of the equipment, which may result in a decrease in the yield of electronic devices. In an attempt to maintain equipment efficiency and the yield of electronic devices, a cleaning process is often performed to remove the by-product buildup on the sidewall of the processing chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
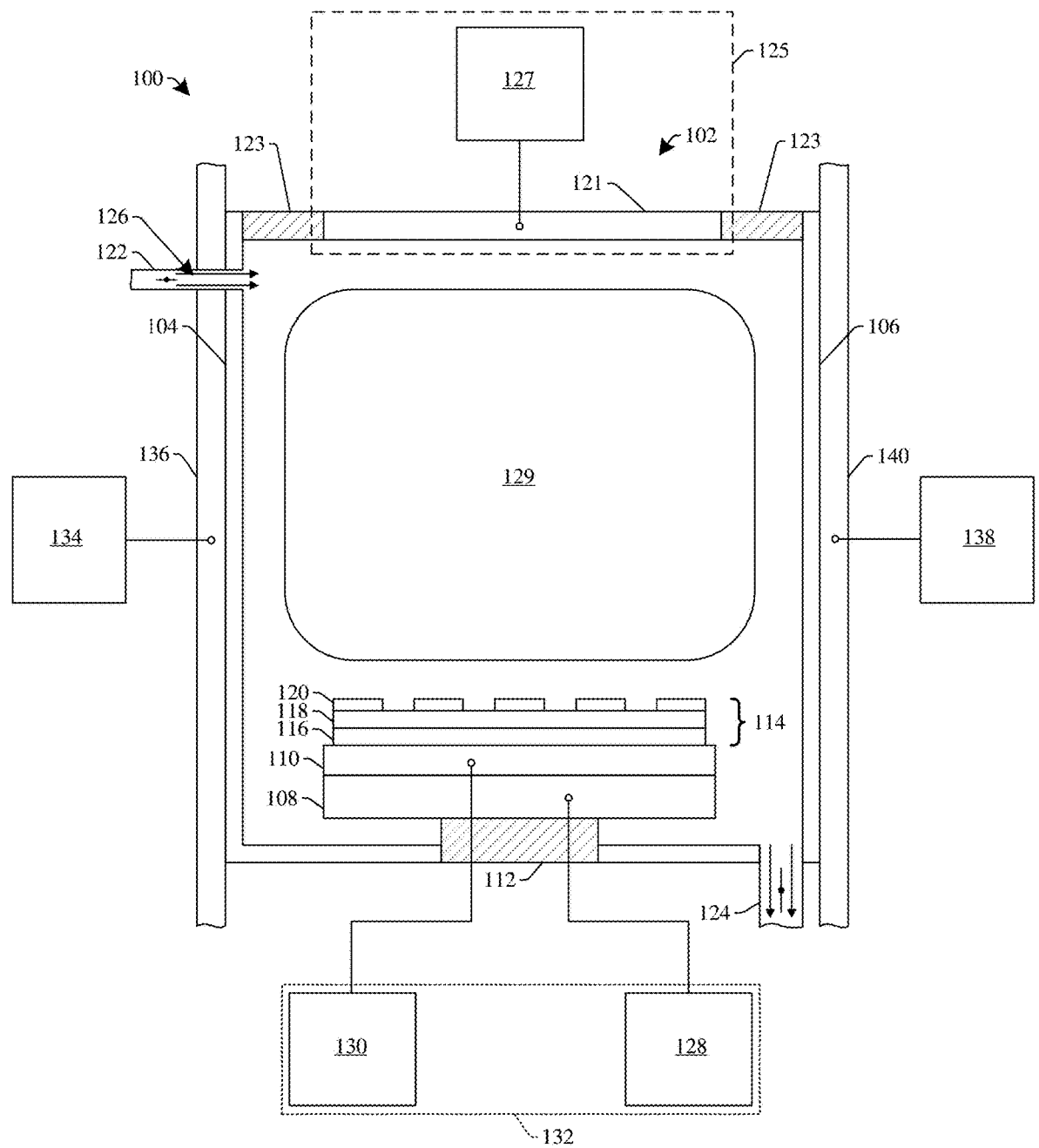
FIG. 1 illustrates a view of some embodiments of a semiconductor processing system capable of implementing a method of the present disclosure for removing by-product that has accumulated on sidewalls of a processing chamber.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) technologies are constantly being improved. These improvements typically involve scaling down of geometries to achieve lower fabrication costs, higher device integration density, higher speeds, and better performance. Due to device scaling, the negative effects of sidewall contamination (e.g., contamination of a substrate resulting from unwanted containments being dislodged from a sidewall of a processing chamber and accumulating on a surface of the substrate) occurring in a processing chamber are magnified.

For example, a workpiece may be loaded into a processing chamber of a plasma etching system. The workpiece may comprise a patterned photoresist layer disposed over an inert metal layer (e.g., silver, copper, etc.). The plasma processing system generates a plasma inside the processing chamber to selectively etch the inert metal layer. During this process, non-volatile by-product is generated and often accumulates on sidewalls of the processing chamber. As the workpiece (or subsequent workpieces) undergoes processing in the processing chamber, the plasma will break some of the bonds of the non-volatile by-product disposed on the processing chamber sidewalls causing atoms of the non-volatile by-product to be dislodged from the sidewall. Accordingly, atoms of the non-volatile by-product may accumulate as contaminants on the workpiece disposed inside the processing chamber. The accumulation of non-volatile by-products on the workpiece may result in an improperly functioning integrated circuit on the faulty workpiece. Current waferless auto-clean (WAC) processes are unable to effectively remove this non-volatile by-product from the processing chamber sidewalls due to lack of physical bombardment of the non-volatile by-products. Therefore, a method (and related system) for cleaning a processing chamber that effectively removes non-volatile by-product from processing chamber sidewalls would improve the reliability and cost of ICs by increasing the efficiency of semiconductor processing equipment.

In some embodiments, the present disclosure relates to a method (and related system) for cleaning a processing chamber that effectively removes non-volatile by-product from processing chamber sidewalls. The method comprises performing an etching process on a workpiece within a processing chamber. During the etching process, by-products from the workpiece may be dislodged from the workpiece and adhere to the sidewall of the processing chamber. After the etching process is complete, the workpiece is removed from the processing chamber. After the workpiece is removed from the processing chamber, a processing gas is introduced into the processing chamber and a plasma is generated from the processing gas. Concurrently, a bias voltage is applied to a sidewall electrode to induce ion bombardment of the by-product disposed on the sidewall of the processing chamber. After the by-product has been effectively bombarded, the processing gas and the by-product can be evacuated from the processing chamber. By physically bombarding the by-product, the by-product can be effectively removed from the sidewalls of the processing chamber and evacuated along with the evacuation of the processing gas. Accordingly, because the improved method alters the typical processing chamber cleaning process by applying a bias voltage to a sidewall electrode to induce ion bombardment, the improved method may increase the reliability of ICs and lower the cost of ICs by increasing the efficiency of semiconductor processing equipment.

With reference to FIG. 1, a view of some embodiments of a semiconductor processing system 100 capable of implementing a method of the present disclosure for removing by-product that has accumulated on sidewalls of a processing chamber is provided.

The semiconductor processing system 100 comprises a processing chamber 102 having a first processing chamber sidewall 104 and a second processing chamber sidewall 106. The processing chamber 102 may be, for example, a plasma-enhanced chemical vapor deposition (PE-CVD) chamber. The processing chamber sidewalls 104/106 comprise a conductive material. In some embodiments, the processing chamber 102 may comprise a dielectric layer disposed on sidewalls of the processing chamber 102 that separates an inner chamber from an outer housing of the processing chamber 102.

A lower electrode 108 is disposed within the processing chamber 102. In some embodiments, an electrostatic chuck 110 is also disposed within the processing chamber 102. In some embodiments, the electrostatic chuck 110 comprises the lower electrode 108. In other embodiments, the electrostatic chuck 110 comprises the lower electrode 108 and an electrostatic chuck electrode (not shown). Further, the electrostatic chuck 110 is configured to hold a workpiece 114 throughout various stages of processing the workpiece 114. In some embodiments, the workpiece 114 comprises a metal layer 118 disposed over a substrate 116 and a photoresist layer 120 disposed over the metal layer 118. In some embodiments, the metal layer 118 may be an inert metal, for example, copper, silver, gold, or some other inert metal. Moreover, an electrostatic chuck pedestal 112 may support the lower electrode 108 and the electrostatic chuck 110. In some embodiments, the electrostatic chuck pedestal 112 comprises an electrical insulating material configured to insulate the electrostatic chuck 110 and the lower electrode 108 from the processing chamber sidewalls.

The processing chamber 102 further comprises a processing gas inlet 122 and a processing chamber gas outlet 124. In some embodiments, the processing gas inlet 122 comprises a valve to control the flow of a processing gas 126 into the processing chamber 102, and the processing chamber gas outlet 124 comprises a valve to control the flow of the processing gas 126 out of the processing chamber. Further, in some embodiments, the processing gas inlet 122 and the processing chamber gas outlet 124 allow a pressure inside the processing chamber 102 to be controlled. In some embodiments, the processing chamber gas outlet 124 may be used in conjunction with a vacuum pump to pump the processing chamber 102 down to a vacuum. In other embodiments, the semiconductor processing system 100 comprises a vacuum pump coupled to a separate orifice into the processing chamber 102 that allows the processing chamber to be pumped down to a vacuum.

The semiconductor processing system 100 also comprises a plasma source 125 configured to provide a plasma within the processing chamber 102. In some embodiments the plasma source 125 may comprise a first radio frequency (RF) power generator 127 coupled to an RF antenna 121 that is electrically insulated from the processing chamber sidewalls 104/106 by RF antenna insulators 123. In some embodiments, the RF antenna 121 may comprise two metal electrodes separated by a small distance and may be disposed within the sidewall of the processing chamber 102. This type of RF antenna 121 may be used in a capacitively coupled plasma (CCP) source. In other embodiments, the RF antenna 121 may have a coil-like shape and may be disposed outside the sidewalls of the processing chamber 102. This type of RF antenna 121 may be used in an inductively coupled plasma (ICP) source. In yet other embodiments, the RF antenna 121 may be a sidewall of the processing chamber 102. The first RF power generator 127 is configured to apply a RF signal having an electric potential to the RF antenna 121 to form a plasma 129 from the processing gas 126 inside the processing chamber 102. In some embodiments, the first RF power generator 127 operates in a power range between about 200 W and about 3000 W, and generates an RF signal with a frequency between about 13.56 MHz and about 60 MHz. In some embodiments, a matching network is disposed between the first RF power generator 127 and the RF antenna 121. In other embodiments, the plasma source 125 may comprise a remote plasma source configured to generate a plasma within an upstream plasma generation chamber and to subsequently provide the plasma to the processing chamber 102.

Further, the semiconductor processing system 100 comprises a lower electrode RF power generator 128 coupled to the lower electrode 108. The lower electrode RF power generator 128 comprises a switching element configured to switch between a first terminal having a first electric potential (e.g., about negative 600 V) and a second terminal having a second electric potential (e.g., about 0 V). In some embodiments, the first terminal is also coupled to an RF signal generator. The lower electrode RF power generator is configured to provide a RF signal to the lower electrode 108 to increase the efficiency of the semiconductor processing system 100 (e.g., by maintaining control over a plasma sheath of the plasma). In some embodiments, the lower electrode RF power generator 128 operates in a power range between about 200 W and about 3000 W, and generates an RF signal with a frequency between about 400 kHZ and about 13.56 MHz.

In some embodiments, the lower electrode RF power generator 128 also provides signals to an electrostatic chuck electrode (not shown) disposed within the electrostatic chuck 110. In other embodiments, a separate electrostatic chuck power generator 130 is configured to apply a voltage to the electrostatic chuck electrode (not shown). In yet other embodiments, a second RF power generator 132 comprises the electrostatic chuck power generator 130 and the lower electrode RF power generator 128.

Moreover, the semiconductor processing system 100 comprises a first sidewall voltage generator 134 coupled to a first sidewall electrode 136, and a second sidewall voltage generator 138 coupled to a second sidewall electrode 140. In some embodiments, the first sidewall voltage generate 134 and the second sidewall voltage generate 138 may be a same voltage generator. The first sidewall electrode 136 and the second sidewall electrode 140 comprise an electrical conducting material. In some embodiments, the first sidewall electrode 136 is the first processing chamber sidewall 104 and the second sidewall electrode 140 is the second processing chamber sidewall 106. In other embodiments, the first sidewall electrode 136 is arranged behind the first processing chamber sidewall 104 and the second sidewall electrode 140 is arranged behind the second processing chamber sidewall 106. The first sidewall voltage generator 134 and the second sidewall voltage generator 138 are configured to apply a voltage to the first processing chamber sidewall 104 and the second processing chamber sidewall 106, respectively. In some embodiments, the first sidewall voltage generator 134 and the second sidewall voltage generator 138 may generate a negative AC bias voltage.

By using the first sidewall voltage generator 134 and the second sidewall voltage generator 138 to apply a voltage to the processing chamber sidewalls 104/106, a velocity at which gas particles within the processing chamber are attracted to the processing chamber sidewalls 104/106 is increased. The increased velocity of the gas particles causes the gas particles to bombard a by-product that has collected on the processing chamber sidewalls 104/106 with a sufficient energy to dislodge the by-product from the processing chamber sidewalls 104/106. Once dislodged, the by-product can be evacuated from the processing chamber 102 through the processing chamber gas outlet 124, thereby decreasing contamination of subsequently processed substrates within the processing chamber 102.

Figure 2A:
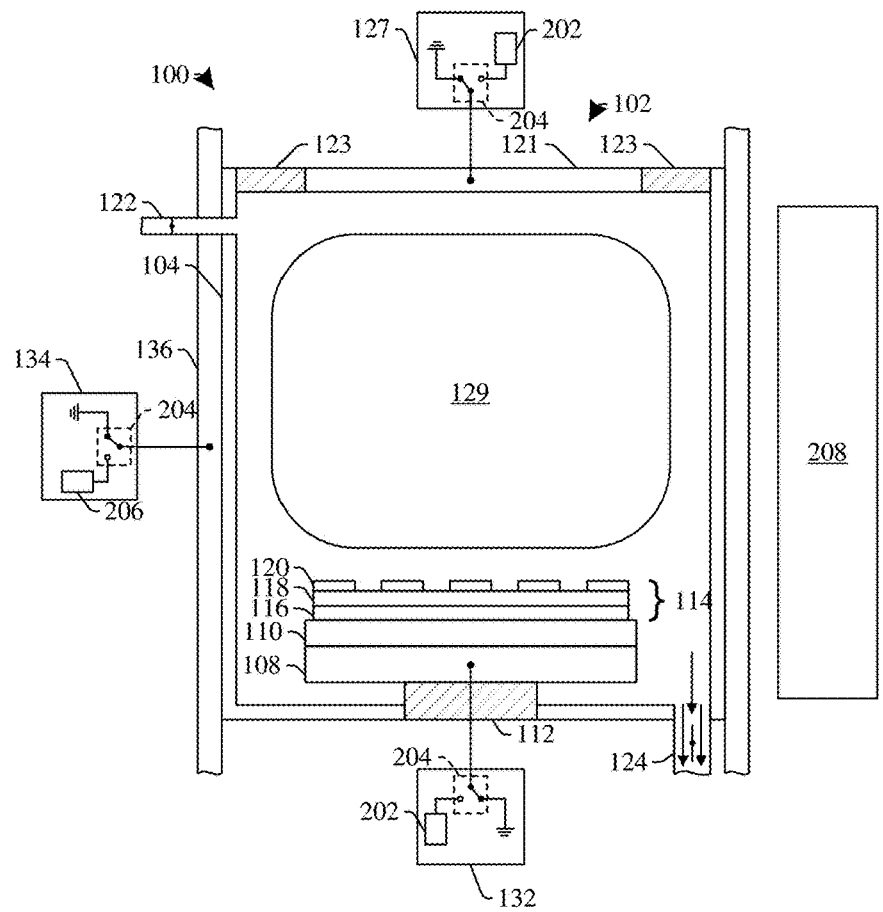
FIGS. 2A-2B illustrates a series of views of more detailed embodiments of a semiconductor processing system capable of implementing a method of the present disclosure for removing by-product that has accumulated on sidewalls of a processing chamber.
Figure 2B:
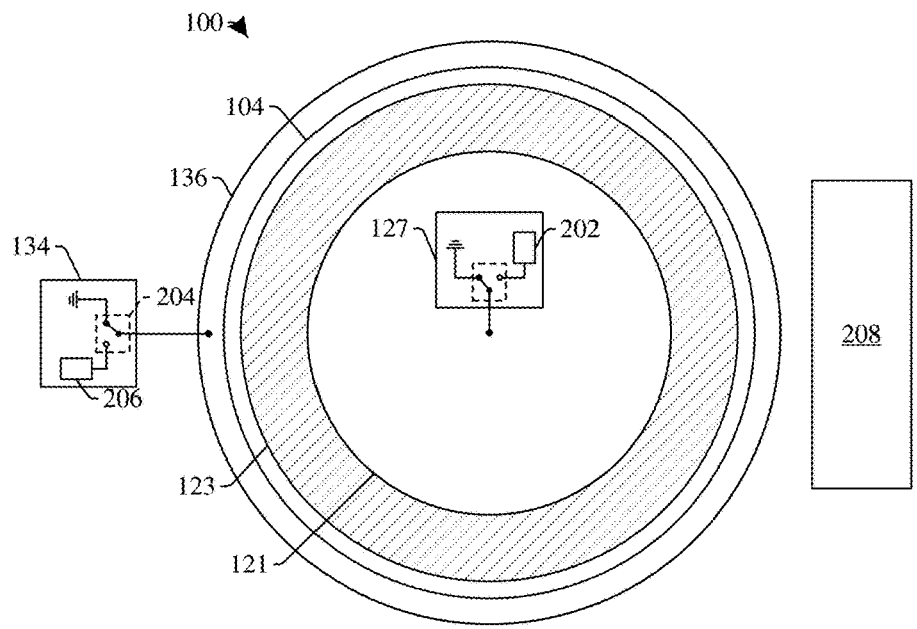

With reference to FIG. 2, a series of views of some more detailed embodiments of a semiconductor processing system 100 capable of implementing a method of the present disclosure for removing by-product that has accumulated on sidewalls of a processing chamber is provided. FIG. 2A illustrates a cross-sectional view of a more detailed embodiments of a semiconductor processing system capable of implementing a method of the present disclosure. FIG. 2B illustrates a top view of a more detailed embodiments of a semiconductor processing system capable of implementing a method of the present disclosure.

As illustrated by the views of FIGS. 2A-2B, both the first RF power generator 127 and the second RF power generator 132 may further comprise a switching element 204 and a RF signal generator 202. The switching element 204 of the first RF power generator 127 is disposed between the RF signal generator 202 and the RF antenna 121. In some embodiments, the switching element 204 of the first RF power generator 127 is configured to open and close a circuit connecting the RF signal generator 202 to the RF antenna 121. In other embodiments, the switching element 204 of the first RF power generator 127 is configured to switch between a first terminal connected to the RF signal generator 202 and a second terminal connected to ground. The switching element 204 of the second RF power generator 132 is disposed between the RF signal generator 202 and the lower electrode 108. The lower electrode 108 is configured to receive a first electric potential (e.g., about negative 600 volts (V)) and a second electric potential (e.g., about 0 V). The switching element 204 of the second RF power generator 132 is configured to switch between a first terminal having a first electric potential (e.g., about negative 600 V) and a second terminal having a second electric potential (e.g., about 0 V). In some embodiments, the first terminal is also coupled to an RF signal generator 202.

The first processing chamber sidewall 104 may be a single continuous piece of conductive material that has a cylindrical shape. In some embodiments, the first sidewall electrode 136 may be a single continuous piece of conductive material having a cylindrical shape that surrounds the first processing chamber sidewall 104. In some such embodiments, the first sidewall voltage generator 134 may be connected to the first sidewall electrode 136 and configured to provide a voltage to the entire first sidewall electrode 136. In some alternative embodiments, a plurality of separate sidewall electrodes may surround the first processing chamber sidewall 104. In some such embodiments, the separate sidewall electrodes may be coupled to different sidewall voltage generators (e.g., a first sidewall electrode may be coupled to a first sidewall voltage generator and a second sidewall electrode may be coupled to a second sidewall voltage generator).

The first sidewall voltage generator 134 may comprise a switching element 204 configured to switch between a first terminal having a first electric potential (e.g., about negative 600 V) and a second terminal having a second electric potential (e.g., about 0 V). In some embodiments, the first terminal is also coupled to a DC bias voltage generator 206. In some embodiments, the DC bias voltage generator 206 is an AC bias voltage generator. The switching element 204 of the first sidewall voltage generator 134 is disposed between the DC bias voltage generator 206 and a first sidewall electrode 136. The switching element 204 is configured to switch between a first terminal connected to the DC bias voltage generator 206 and a second terminal connected to ground. In some embodiments, the DC bias voltage generator 206 outputs a negative voltage in a range of about 0.1 V to about 600 V. Although not illustrated in FIGS. 2A-2B, it will be appreciated that the second sidewall voltage generator 138 may also comprises a switching element 204 and a DC bias voltage generator 206

Moreover, in some embodiments, the semiconductor processing system 100 comprises a heating element 208 to control the temperature inside the processing chamber 102. In some embodiments, the heating element 208 is the processing chamber sidewalls 104/106.

With reference to FIGS. 3A-3G, a series of views of some embodiments of a method for removing by-product that has accumulated on sidewalls of a processing chamber is provided.

Figure 3A:
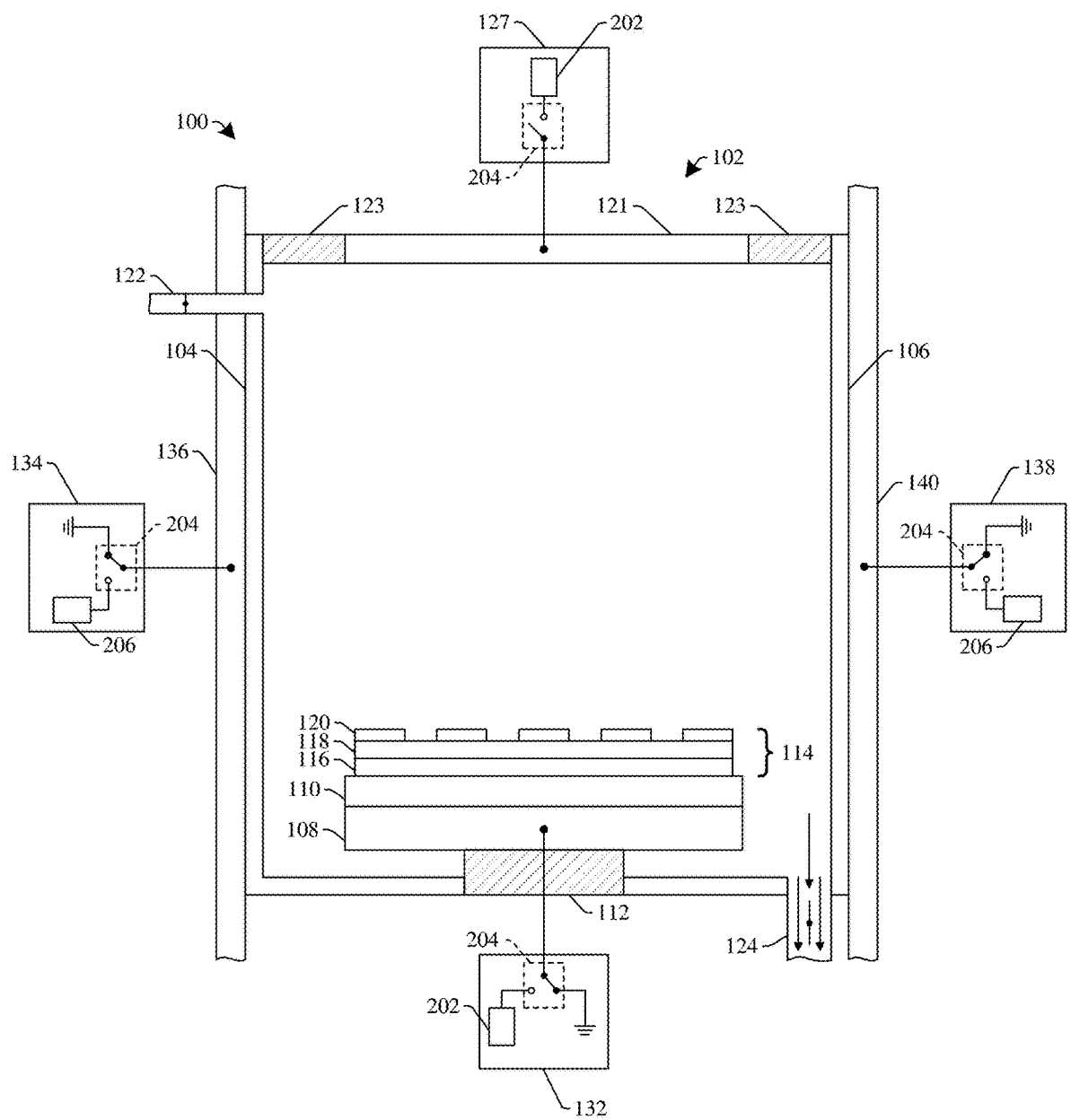
FIGS. 3A-3G illustrate a series of views of some embodiments of a method for removing by-product that has accumulated on sidewalls of a processing chamber.

As illustrated by FIG. 3A, a semiconductor processing system 100 is provided. The semiconductor processing system 100 is pumping down a pressure of a processing chamber 102 in preparation of performing an etching process on a workpiece 114. In some embodiments, the pressure in the processing chamber 102 is controlled between 20 millitorr (mT) and 100 mT. The workpiece 114 is arranged on an electrostatic chuck 110 inside the processing chamber 102. In some embodiments, the workpiece 114 comprises a photoresist layer 120 disposed over a metal layer 118 that is disposed over a substrate 116.

Further, a valve of the processing chamber gas outlet 124 is open while a valve of the processing gas inlet 122 is closed. A vacuum pump (not shown) may be connected downstream from the valve of the processing chamber gas outlet 124. The vacuum pump is configured to pump gas out of the processing chamber 102 to lower the pressure of the processing chamber 102. In some embodiments, the semiconductor processing system 100 performs a purging step to remove unwanted gas molecules from the processing chamber 102 prior to pumping down the pressure of the processing chamber 102.

As the pressure of the processing chamber is pumped down, the switching element 204 disposed in the first RF power generator 127 may open a circuit between the RF antenna 121 and the RF signal generator 202 of the first RF power generator 127. Further, the switching element 204 of the second RF power generator 132 may connect the lower electrode 108 to ground. Also, the switching element 204 of the first sidewall voltage generator 134 connects the first sidewall electrode 136 to ground. In addition, the switching element 204 of the second sidewall voltage generator 138 connects the second sidewall electrode 140 to ground.

Figure 3B:
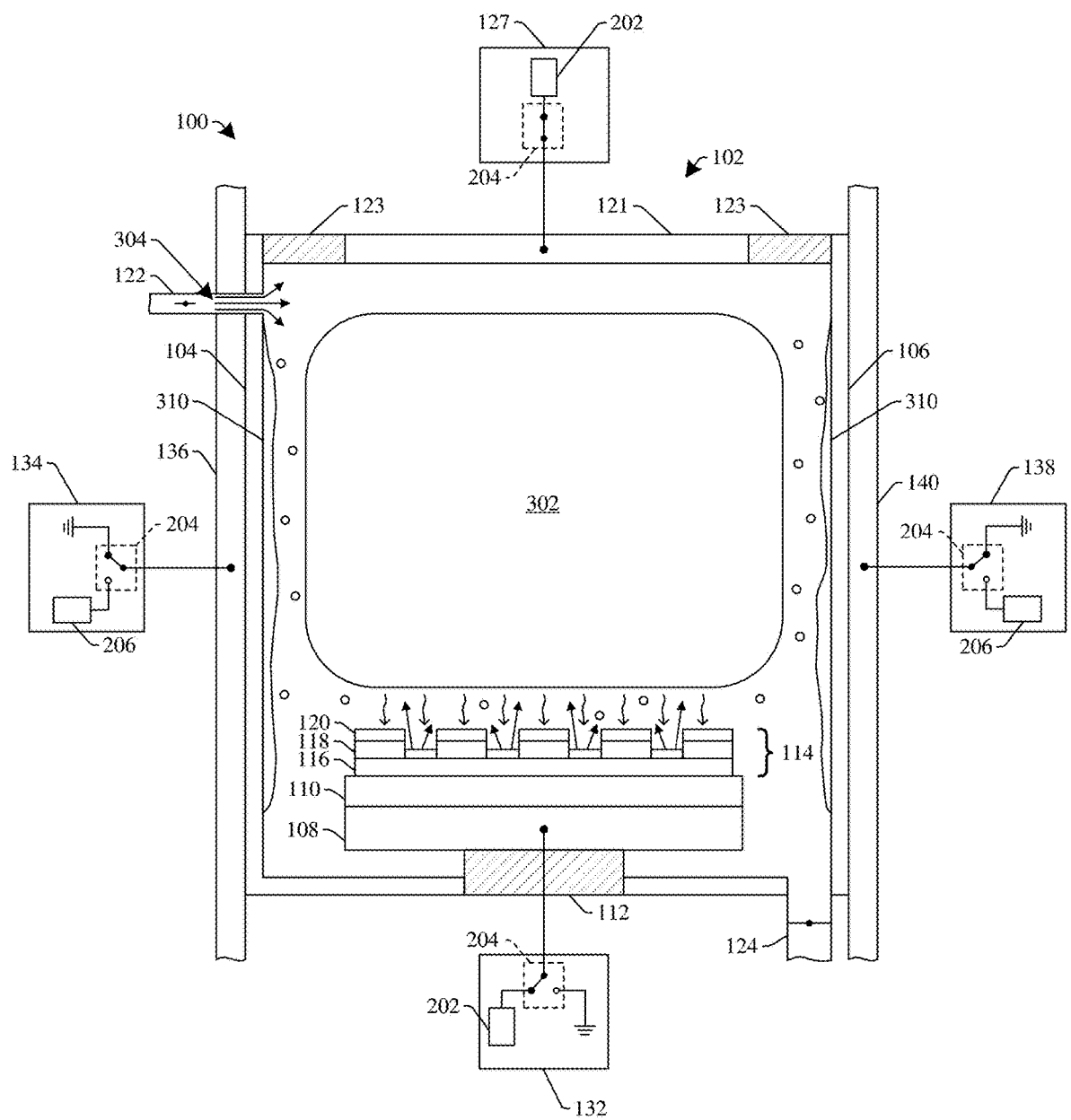

As illustrated by FIG. 3B, the workpiece 114 is being etched by an etching plasma 302. In some embodiments, the etching plasma 302 is formed by flowing an etching gas 304 into the processing chamber 102 and applying an RF signal to ignite the etching plasma 302. For example, the valve of the processing gas inlet 122 may open and allow the etching gas 304 to flow into the processing chamber 102. After the etching gas 304 has flowed into the processing chamber 102, the switching element 204 of the first RF power generator 127 closes the circuit between the RF signal generator 202 of the first RF power generator 127 and the RF antenna 121. In some embodiments, the first RF power generator 127 operates in a power range between about 200 W and about 3000 W, and generates an RF signal with a frequency between about 13.56 MHz and about 60 MHz. In some embodiments, the switching element 204 of the second RF power generator 132 also switches such that the RF signal generator 202 of the second RF power generator 132 is connected to the lower electrode 108. In some embodiments, the second RF power generator 132 operates in a power range between about 200 W and about 3000 W, and generates an RF signal with a frequency between about 400 k MHz and about 13.56 MHz. Accordingly, the RF signals output by the RF antenna 121 and the lower electrode 108 form the etching plasma 302, such that the workpiece 114 can be etched.

In some embodiments, the etching plasma 302 etches away portions of a metal layer 118. As the etching plasma 302 etches away portions of the metal layer 118, a large amount of by-product 210 is generated and accumulates on the processing chamber sidewalls 104/106. In some embodiments, the by-product 210 may be a non-volatile by-product, such as, copper, silver, gold, or some other non-volatile by-product. Therefore, as the workpiece 114 (or subsequent workpieces) continues to be etched, the etching plasma 302 will break some of the bonds of the non-volatile by-product 310 disposed on the processing chamber sidewalls 104/106 causing atoms of the non-volatile by-product to dislodged from the sidewalls. Accordingly, atoms of the non-volatile by-product 310 may accumulate as contaminants on the workpiece 114 disposed inside the processing chamber 102, which may result in a faulty workpiece.

Figure 3C:
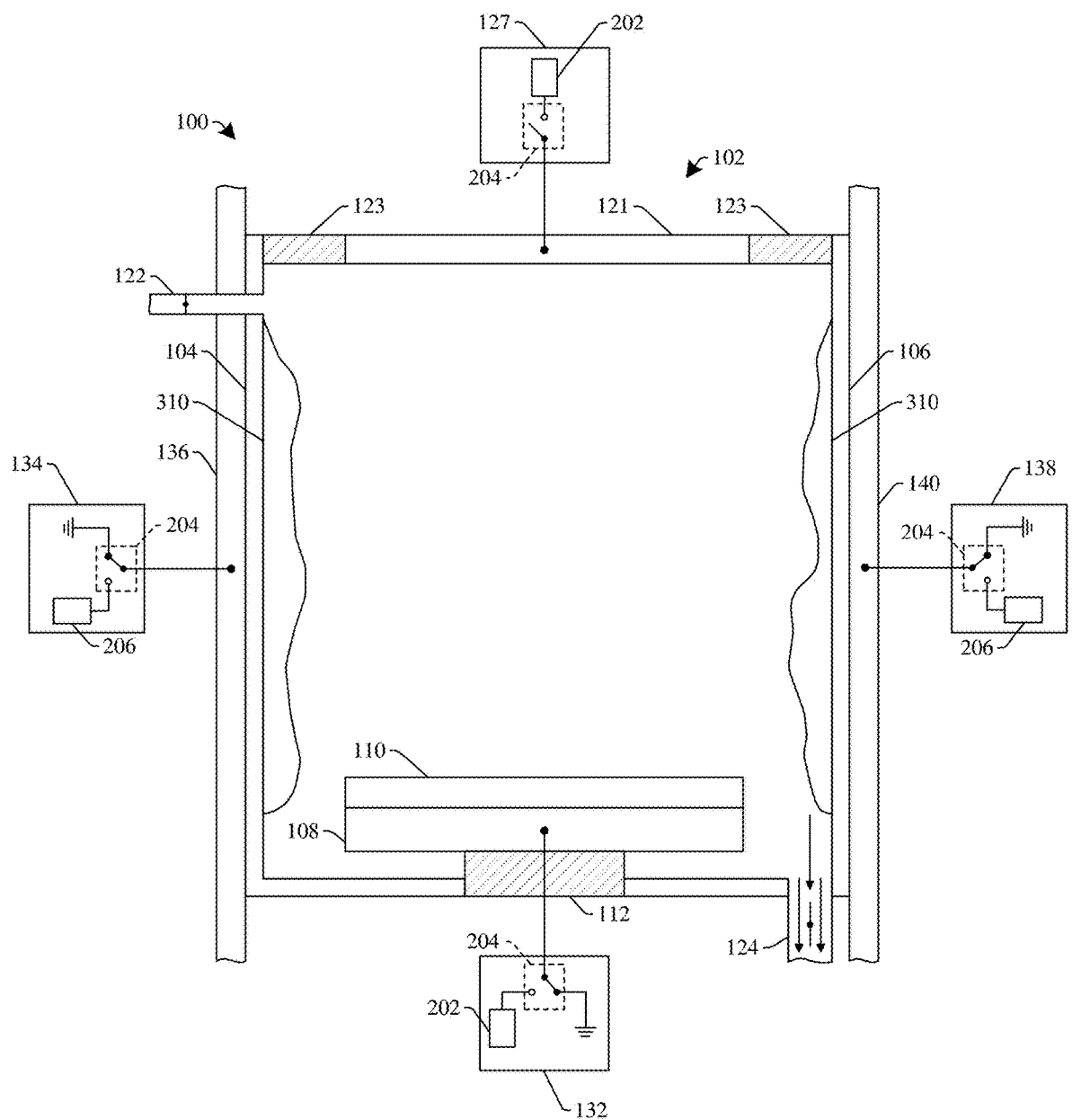

As illustrated by FIG. 3C, the workpiece 114 has been removed from the processing chamber 102, and the pressure of the processing chamber 102 is being pumped down in preparation of cleaning the non-volatile by-product 310 from the processing chamber sidewalls 104/106. In some embodiments, because the workpiece 114 is removed from the processing chamber 102 and the cleaning process is not a wet cleaning process, the cleaning process to remove the non-volatile by-product 310 from the processing chamber sidewalls 104/106 is referred to as a waferless auto-clean (WAC) process. In some embodiments, the pressure of the processing chamber 102 is lowered to a range of about 40 millitorr (mT) to about 80 mT. In yet further embodiments, a heating element (not shown) heats the contents of the processing chamber 102 to a range of about 20° C. to about 80° C.

In some embodiments, during the pumping down phase of the cleaning process, the switching element 204 of the first RF power generator 127 opens the circuit between the RF signal generator 202 of the first RF power generator 127 and the RF antenna 121. Further, the switching element 204 of the second RF power generator 132 switches such that the lower electrode 108 is connected to ground. Moreover, the switching elements 204 of the first sidewall voltage generator 134 and the second sidewall voltage generator 138 connect the first sidewall electrode 136 and the second sidewall electrode 140 to ground, respectively.

Figure 3D:
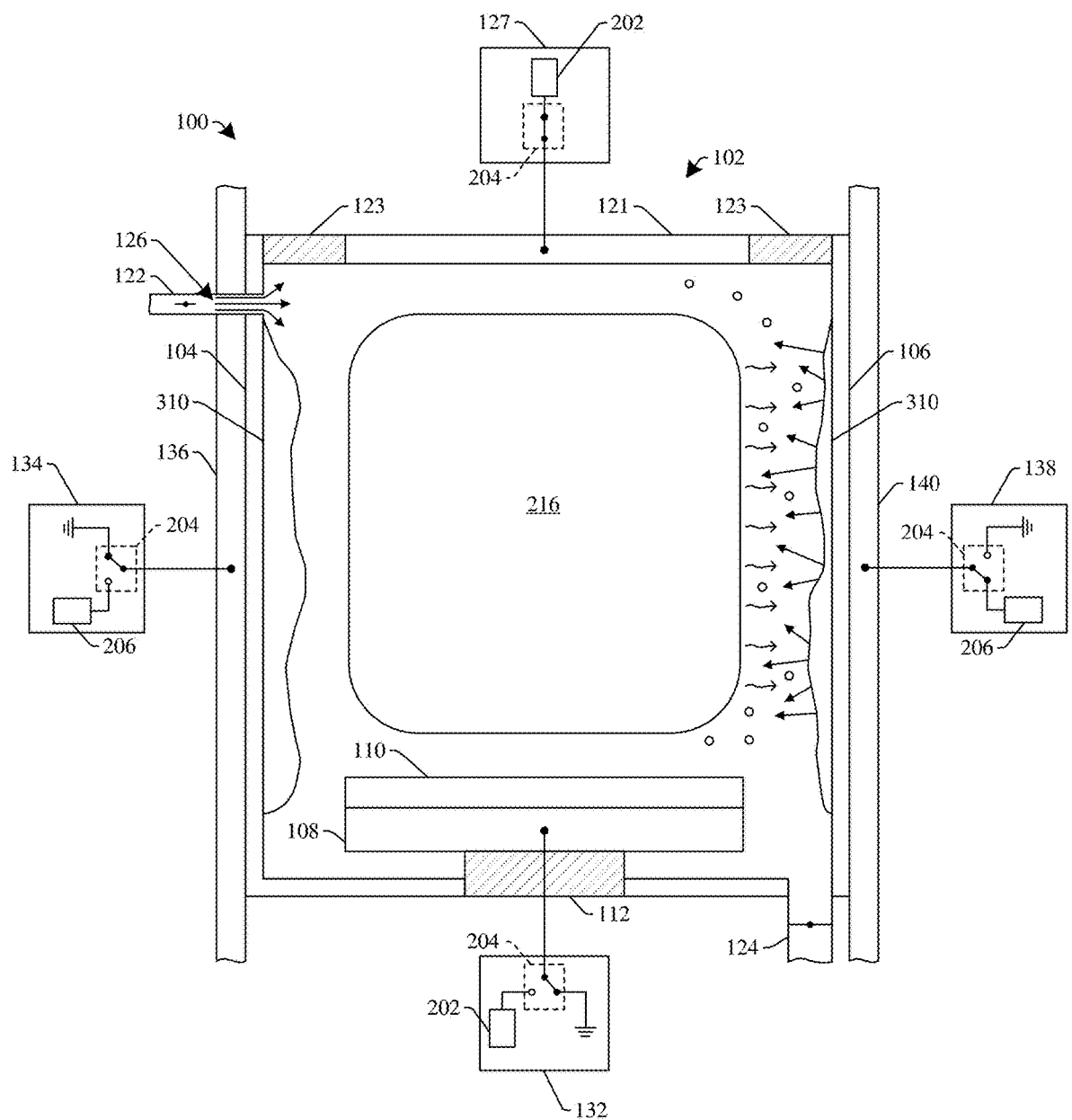

As illustrated by FIG. 3D, the non-volatile by-product 310 disposed on the second processing chamber sidewall 106 is being cleaned from the second processing chamber sidewall 106. In some embodiments, the cleaning plasma 216 is formed inside the processing chamber 102 by flowing a processing gas 126 into the processing chamber 102 and igniting the plasma via RF signals. In some embodiments, the processing gas 126 may comprise, for example, oxygen, chlorine, boron, nitrogen, hydrogen, or a combination of the foregoing. For example, the valve of the processing gas inlet 122 may open and allow the processing gas 126 to flow into the processing chamber 102. After the processing gas 126 has flowed into the processing chamber 102, the switching element 204 of the first RF power generator 127 closes the circuit between the RF signal generator 202 of the first RF power generator 127 and the RF antenna 121, such that the RF antenna 121 outputs RF signals.

Unlike during the etching process depicted in FIG. 3B, the switching element 204 of the second RF power generator 132 connects the lower electrode 108 to ground in order to protect the electrostatic chuck 110 during the cleaning process. Rather, the switching element 204 of the second sidewall voltage generator 138 switches such that the second sidewall electrode 140 is connected to the DC bias voltage generator 206 of the second sidewall voltage generator 138. In some embodiments, the second sidewall electrode 140 may be connected to the DC bias voltage generator 206 for a time period in a range of about 400 seconds to about 600 seconds. In other embodiments, the second sidewall electrode 140 may be connected to the DC bias voltage generator 206 for a time period in a range of about 200 seconds to about 400 seconds. By connecting the second sidewall electrode 140 to the DC bias voltage generator 206 of the second sidewall voltage generator 138, the non-volatile by-product 310 disposed on the second processing chamber sidewall 106 is effectively cleaned due to the voltage potential between the cleaning plasma 216 and the second sidewall electrode 140 inducing physical bombardment (e.g., ion bombardment) of the non-volatile by-product 310.

Figure 3E:
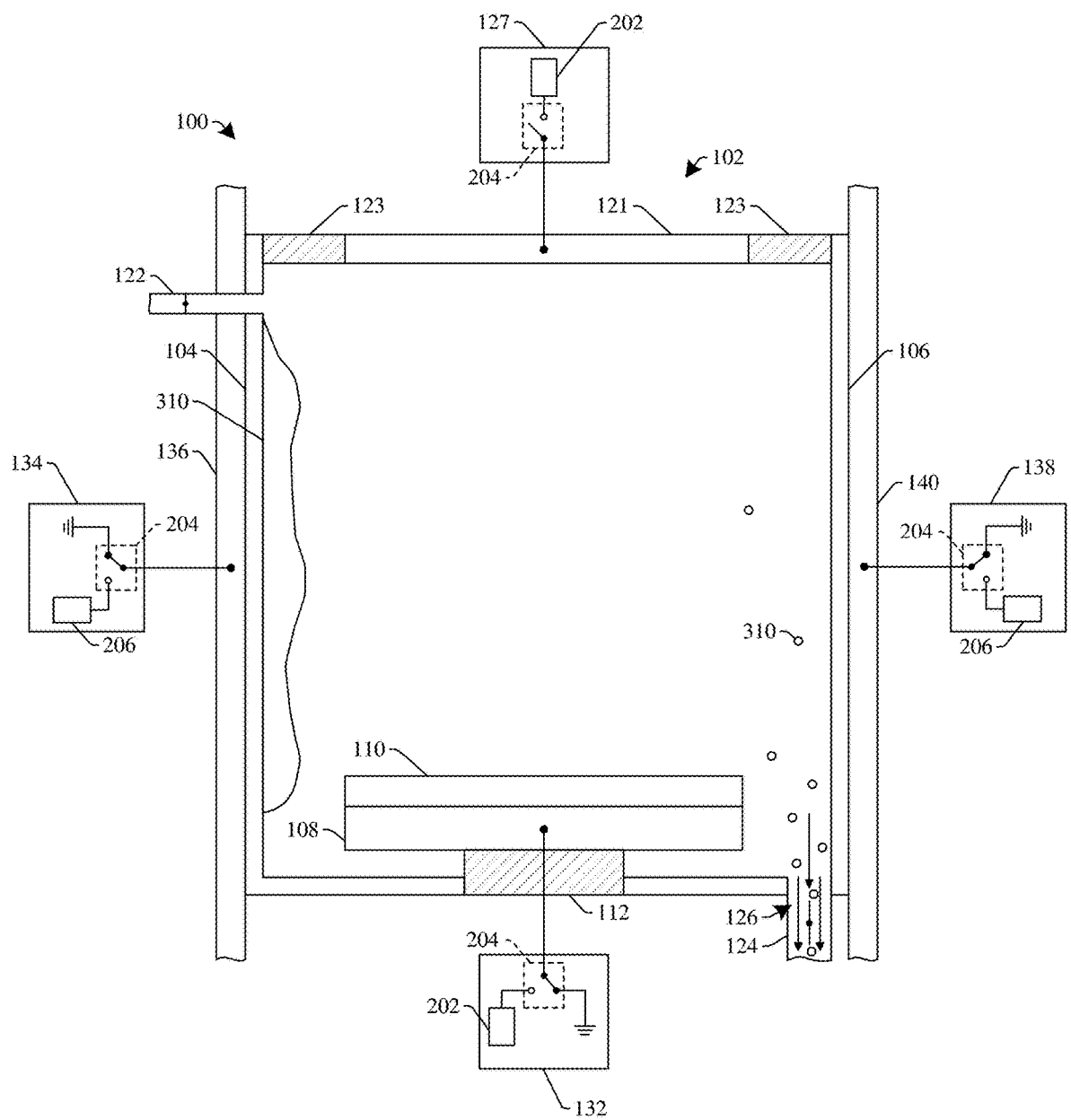

As illustrated by FIG. 3E, after the non-volatile by-product 310 has been effectively bombarded to remove the non-volatile by-product 310 disposed on the second processing chamber sidewall 106, the processing gas 126 and the non-volatile by-product 310 is evacuated out of the processing chamber 102 via the processing chamber gas outlet 124. In some embodiments, during evacuation of the processing gas 126 and non-volatile by-product 310, the switching element 204 of the first RF power generator 127 disconnects the RF antenna 121 from the RF signal generator 202 of the first RF power generator 127. Further, the switching element 204 of the second sidewall voltage generator 138 switches to connect the second sidewall electrode 140 to ground. In some embodiments, the valve of the processing chamber gas outlet 124 remains open after the processing gas 126 has been evacuated to pump down the pressure of the processing chamber 102 for a subsequent process.

Figure 3F:
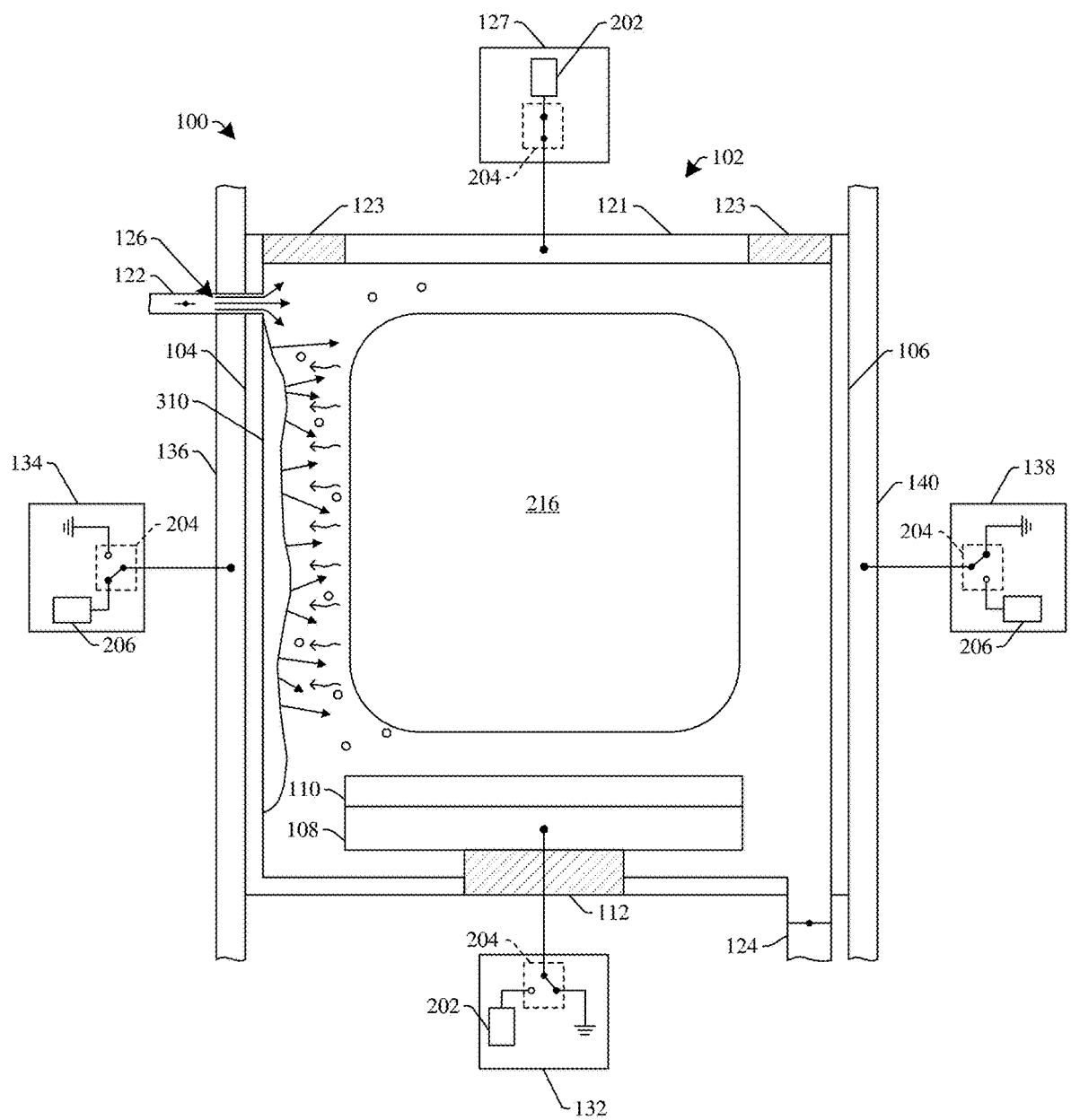

As illustrated by FIG. 3F, the non-volatile by-product 310 disposed on the first processing chamber sidewall 104 is being cleaned from the first processing chamber sidewall 104. In some embodiments, the cleaning plasma 216 is formed inside the processing chamber 102 by flowing a processing gas 126 into the processing chamber 102 and igniting the plasma via RF signals. In some embodiments, the processing gas 126 may comprise, for example, oxygen, chlorine, boron, nitrogen, hydrogen, or a combination of the foregoing. For example, the valve of the processing gas inlet 122 may open and allow the processing gas 126 to flow into the processing chamber 102. After the processing gas 126 has flowed into the processing chamber 102, the switching element 204 of the first RF power generator 127 closes the circuit between the RF signal generator 202 of the first RF power generator 127 and the RF antenna 121.

Unlike during the etching process depicted in FIG. 3B, the switching element 204 of the second RF power generator 132 connects the lower electrode 108 to ground in order to protect the electrostatic chuck 110 during the cleaning process. Rather, the switching element 204 of the first sidewall voltage generator 134 switches such that the first sidewall electrode 136 is connected to the DC bias voltage generator 206 of the first sidewall voltage generator 134. In some embodiments, the first sidewall electrode 136 may be connected to the DC bias voltage generator 206 for a time period in a range of about 400 seconds to about 600 seconds. In other embodiments, the first sidewall electrode 136 may be connected to the DC bias voltage generator 206 for a time period in a range of about 200 seconds to about 400 seconds. By connecting the first sidewall electrode 136 to the DC bias voltage generator 206 of the first sidewall voltage generator 134, the non-volatile by-product 310 disposed on the first processing chamber sidewall 104 is effectively cleaned due to the voltage potential between the cleaning plasma 216 and the first sidewall electrode 136 inducing physical bombardment (e.g., ion bombardment) of the non-volatile by-product 310.

Figure 3G:
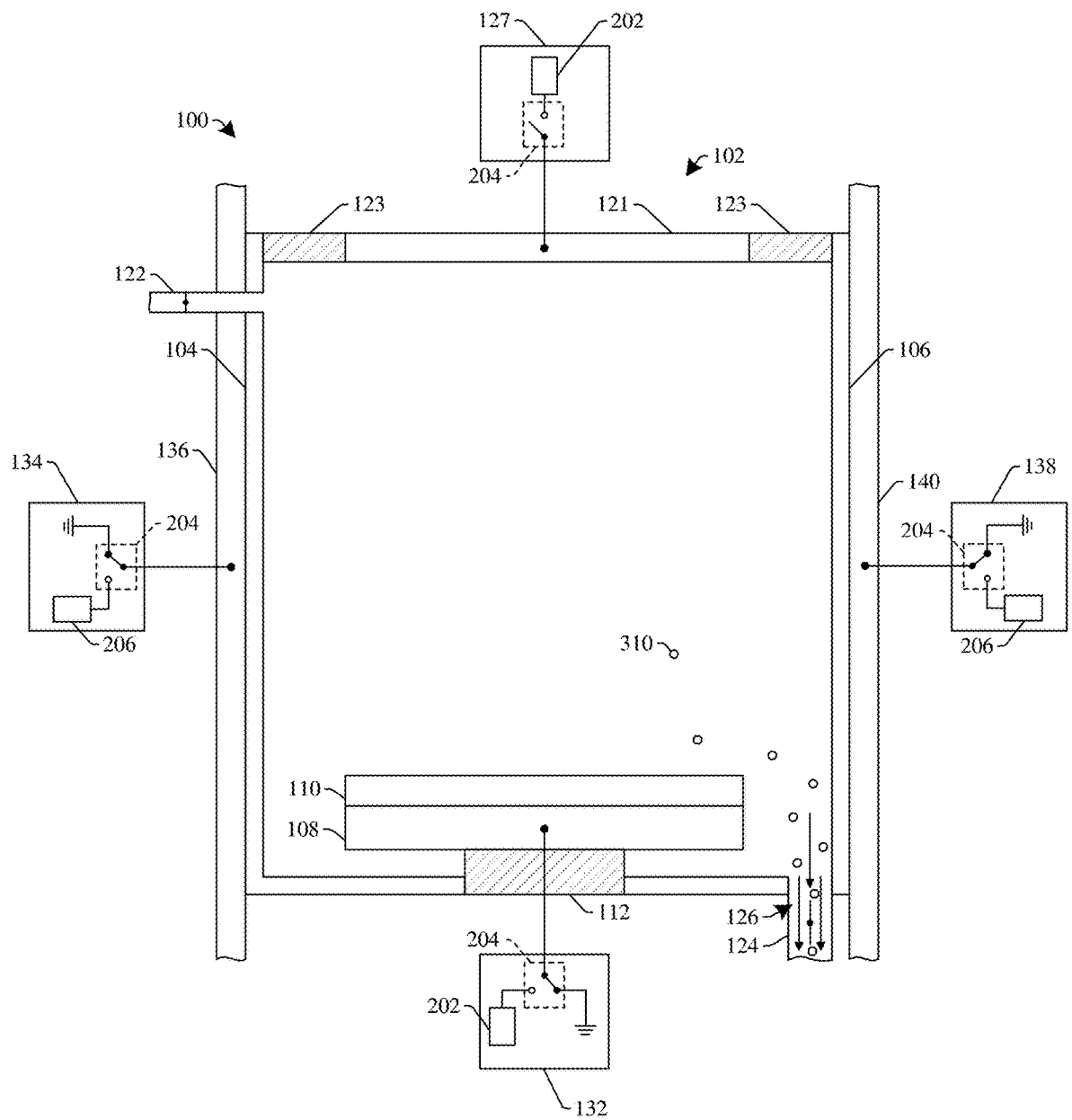

As illustrated by FIG. 3G, after the non-volatile by-product 310 has been effectively bombarded to remove the non-volatile by-product 310 disposed on the first processing chamber sidewall 104, the processing gas 126 and the non-volatile by-product 310 is evacuated out of the processing chamber 102 via the processing chamber gas outlet 124. In some embodiments, during evacuation of the processing gas 126 and non-volatile by-product 310, the switching element 204 of the first RF power generator 127 disconnects the RF antenna 121 from the RF signal generator 202 of the first RF power generator 127. Further, the switching element 204 of the first sidewall voltage generator 134 switches to connect the first sidewall electrode 136 to ground. In some embodiments, the valve of the processing chamber gas outlet 124 remains open after the processing gas 126 has been evacuated to pump down the pressure of the processing chamber 102 for a subsequent process.

Figure 4A:
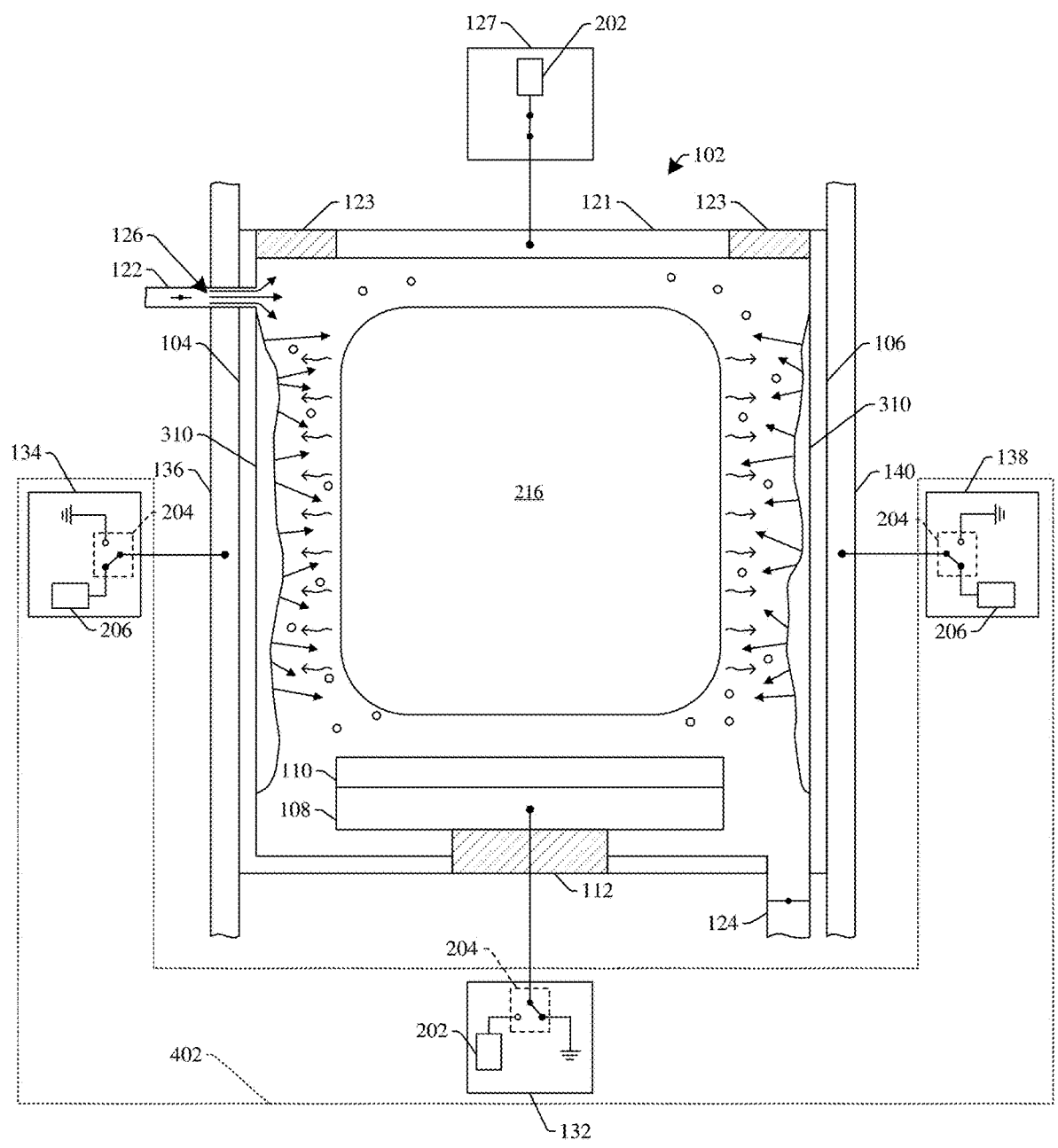
FIGS. 4A-4B illustrate a series of views of some more embodiments of a method for removing by-product that has accumulated on sidewalls of a processing chamber.
Figure 4B:
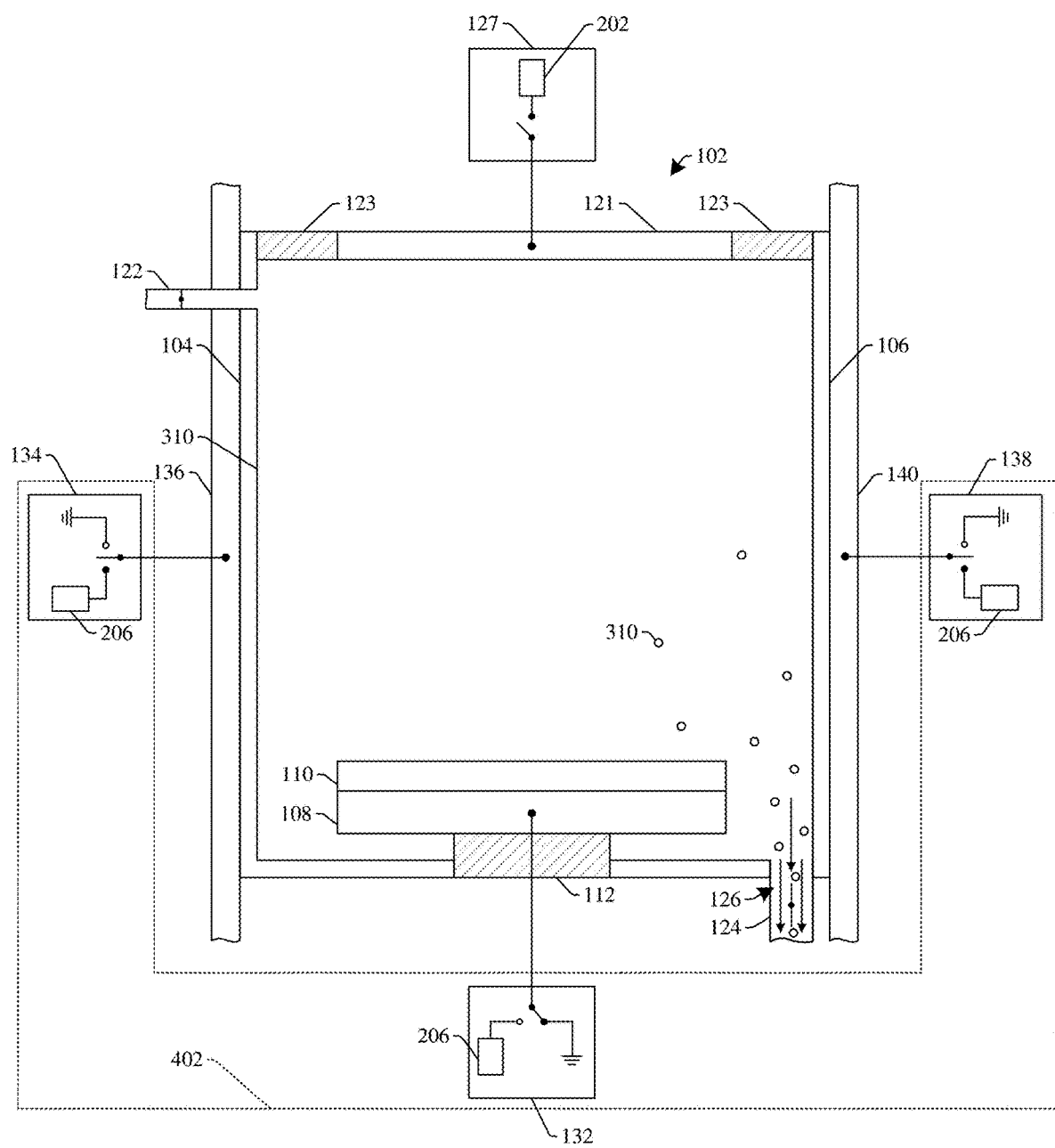

With reference to FIGS. 4A-4B, a series of views of some more embodiments of a method for removing by-product that has accumulated on sidewalls of a processing chamber is provided.

As illustrated by FIG. 4A, the semiconductor processing system 100 comprises a power switching manifold 402. In some embodiments, the power switching manifold 402 comprises the second RF power generator 132, the first sidewall voltage generator 134, and the second sidewall voltage generator 138 and controls their respective switching elements 204. In further embodiments, the power switching manifold 402 comprises a plurality of switches configured to switch between a first electric potential node, a second electric potential node, and/or a RF signal generator node, such that the power switching manifold controls the node connections to the lower electrode 108, electrostatic chuck 110, the first sidewall electrode 136, and the second sidewall electrode 140. In some embodiments, the second electric potential is larger than the first electric potential. For example, the first electric potential is about 0 V and the second electric potential is about negative 600 V.

As further illustrated by FIG. 4A, the non-volatile by-product 310 disposed on the first processing chamber sidewall 104 is being cleaned from the first processing chamber sidewall 104 at the same time the non-volatile by-product 310 disposed on the second processing chamber sidewall 106 is being cleaned from the second processing chamber sidewall 106. Similar to the cleaning process depicted in FIGS. 3D and 3F, the power switching manifold 402 switches the switching element 204 of the second RF power generator 132 to connect the lower electrode 108 to ground in order to protect the electrostatic chuck 110 during the cleaning process. However, unlike the cleaning process depicted in FIGS. 3D and 3F, the power switching manifold 402 switches the switching elements 204 of both the first sidewall voltage generator 134 and the second sidewall voltage generator 138 to connect them to their respective DC bias voltage generator 206. Accordingly, in some embodiments, the non-volatile by-product 310 disposed on both the first processing chamber sidewall 104 and the second processing chamber sidewall 106 can be effectively cleaned at the same time by inducing physical bombardment (e.g., ion bombardment) of the non-volatile by-product 310.

As illustrated by FIG. 4B, after the non-volatile by-product 310 has been effectively bombarded to remove the non-volatile by-product 310 disposed on both the first processing chamber sidewall 104 and the second processing chamber sidewall 106, the processing gas 126 and the non-volatile by-product 310 is evacuated out of the processing chamber 102 via the processing chamber gas outlet 124. In some embodiments, during evacuation of the processing gas 126 and non-volatile by-product 310, the power switching manifold 402 switches the switching element 204 of the first RF power generator 127 to disconnect the RF antenna 121 from the RF signal generator 202 of the first RF power generator 127. Further, the power switching manifold 402 switches the switching elements 204 of both the first sidewall voltage generator 134 and the second sidewall voltage generator 138 from their respective first terminal to their respective second terminal, which connects both the first sidewall electrode 136 and the second sidewall electrode 140 to ground.

Figure 5:
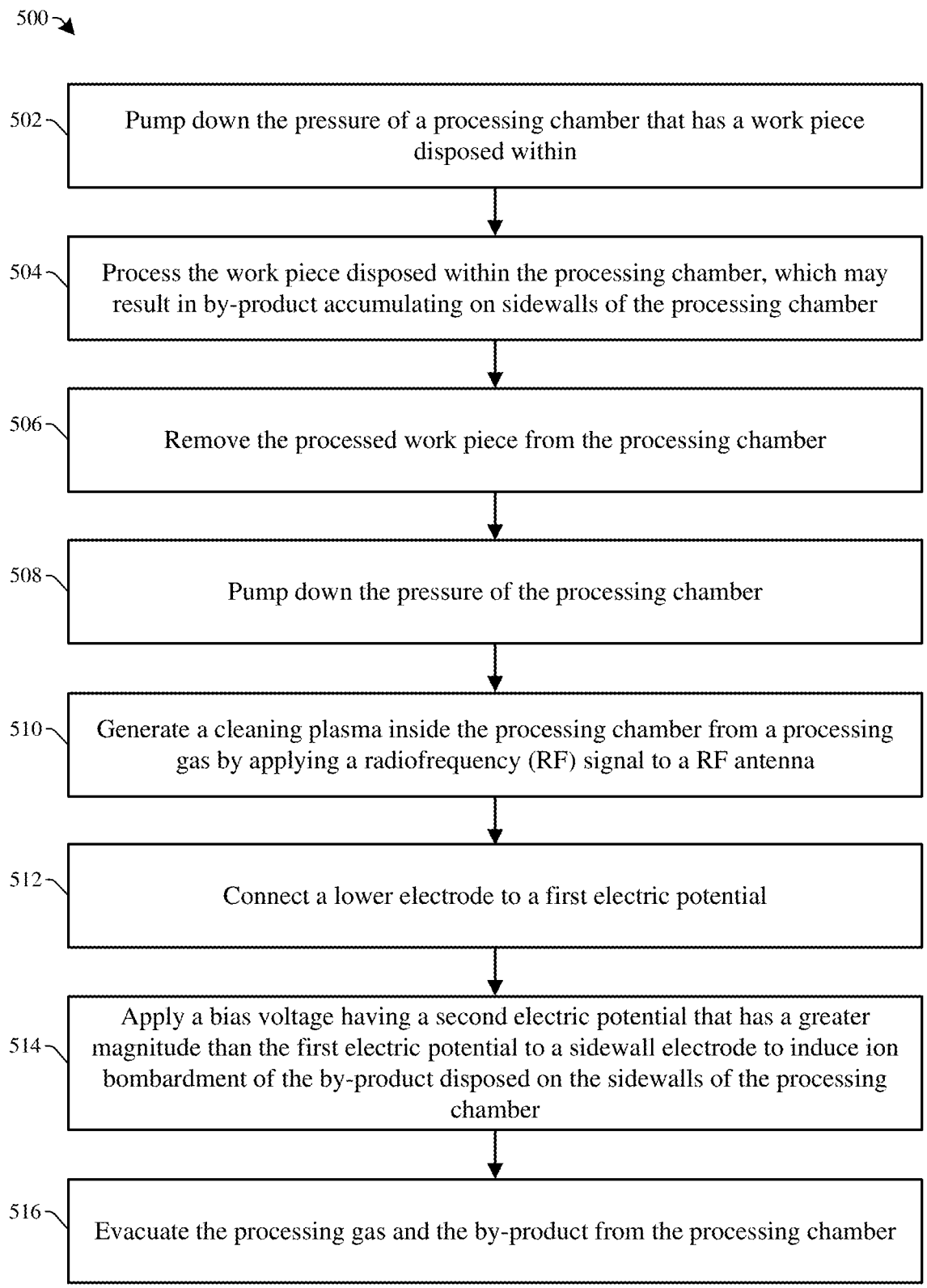
FIG. 5 illustrates a flowchart of some embodiments of the method for removing by-product that has accumulated on sidewalls of a processing chamber.

With reference to FIG. 5, a flowchart 500 of some embodiments of the method for removing by-product that has accumulated on sidewalls of a processing chamber is provided. While the disclosed method and other methods illustrated and/or described herein may be illustrated and/or described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 502, the pressure of a processing chamber that has a workpiece disposed within is pumped down. An example of act 502 can be seen with reference to previously illustrated FIG. 3A.

At 504, the workpiece disposed within the processing chamber is processed, which may result in by-product accumulating on sidewalls of the processing chamber. An example of act 504 can be seen with reference to previously illustrated FIG. 3B.

At 506, the processed workpiece is removed from the processing chamber. An example of act 506 can be seen with reference to previously illustrated FIG. 3C.

At 508, the pressure of the processing chamber is pumped down. An example of act 508 can be seen with reference to previously illustrated FIG. 3C.

At 510, a cleaning plasma is generated inside the processing chamber from a processing gas by applying a radio frequency (RF) signal to a RF antenna. An example of act 510 can be seen with reference to previously illustrated FIG. 3D.

At 512, a lower electrode is connected to a first electric potential. An example of act 512 can be seen with reference to previously illustrated FIG. 3D.

At 514, a bias voltage having a second electric potential that has a greater magnitude than the first electric potential is applied to a sidewall electrode to induce ion bombardment of the by-product disposed on the sidewalls of the processing chamber. An example of act 514 can be seen with reference to previously illustrated FIG. 3D.

At 516, the processing gas and the by-product are evacuated from the processing chamber. An example of act 516 can be seen with reference to previously illustrated FIG. 3E.

Thus, as can be appreciated from above, the present disclosure relates to an improved method (and related apparatus) for removing by-product that has accumulated on semiconductor processing chamber sidewalls.

Accordingly, in some embodiments, the present application provides a method for cleaning a processing chamber. The method includes introducing a processing a gas into a processing chamber that has a by-product disposed along sidewalls of the processing chamber. A plasma is generated from the processing gas using a radio frequency (RF) signal. A lower electrode is connected to a first electric potential. Concurrently, a bias voltage having a second electric potential is applied to a sidewall electrode to induce ion bombardment of the by-product, in which the second electric potential has a larger magnitude than the first electric potential. The processing gas is then evacuated from the processing chamber.

In other embodiments, the present application provides a plasma processing apparatus. The plasma processing apparatus includes a processing chamber comprising a lower electrode arranged below an upper surface of an electrostatic chuck configured to receive a workpiece and between sidewalls of the processing chamber. A first radio frequency (RF) power generator is electrically connected to a RF antenna. A sidewall voltage generator is electrically connected to a sidewall electrode. A second RF power generator is electrically connected to the lower electrode.

In yet other embodiments, the present application provides a method for cleaning a processing chamber. The method includes connecting a switching element of a sidewall voltage generator to a first electric potential, thereby connecting a sidewall electrode to the first electric potential. A switching element of a second radio frequency (RF) power generator is switched to a second electric potential, thereby connecting a lower electrode to the second electric potential. A substrate comprising a first material is processed inside a processing chamber, in which the process generates by-product comprising the first material that adheres to a sidewall of the processing chamber. The processed substrate is removed from the processing chamber. A processing gas is introduced into the processing chamber. The switching element of the second RF power generator is switched to the first electric potential, and concurrently the switching element of the sidewall voltage generator is switched to a third electric potential. A cleaning plasma is generated inside the processing chamber by connecting a first RF power generator to a RF antenna. The processing gas and the by-product are then evacuated from the processing chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning a processing chamber, the method comprising:
    introducing a processing gas into the processing chamber;
    connecting a lower electrode that is disposed within the processing chamber to a first electric potential, wherein an electrostatic chuck is disposed within the processing chamber, and wherein the electrostatic chuck and the lower electrode are electrically insulated from a sidewall of the processing chamber;
    applying a bias voltage having a second electric potential to a first sidewall electrode that is adjacent to the sidewall of the processing chamber and that is outside of the processing chamber, the first sidewall electrode vertically extending from below a top of the electrostatic chuck to a top of an interior cavity of the processing chamber, wherein the first electric potential is ground and the second electric potential has a larger magnitude than the first electric potential;
    generating a plasma from the processing gas inside the processing chamber; and
    evacuating the processing gas from the processing chamber.

2. The method of claim 1, wherein applying the bias voltage to the first sidewall electrode induces ion-bombardment of a contamination material disposed on the sidewall of the processing chamber.

3. The method of claim 2, wherein generating the plasma comprises applying a radio frequency (RF) signal to a RF antenna.

4. The method of claim 1, wherein:
an electrostatic chuck pedestal is disposed in the processing chamber;
the electrostatic chuck pedestal supports both the electrostatic chuck and the lower electrode; and
the electrostatic chuck pedestal vertically separates a lower surface of the processing chamber from both the lower electrode and the electrostatic chuck.

5. The method of claim 1, further comprising:
before the processing gas is introduced into the processing chamber, etching a workpiece inside the processing chamber, wherein etching the workpiece dislodges a material from the workpiece that adheres to the sidewall of the processing chamber; and
before the processing gas is introduced into the processing chamber and after the workpiece has been etched, removing the workpiece from the processing chamber.

6. The method of claim 5, wherein applying the bias voltage to the first sidewall electrode induces ion-bombardment of the material.

7. The method of claim 1, wherein the processing gas comprises chlorine or oxygen.

8. The method of claim 1, wherein the second electric potential is between about negative 0.1 Volts (V) and about negative 600 V.

9. The method of claim 1, wherein the first sidewall electrode is laterally separated from an RF antenna by an RF antenna insulator.

10. The method of claim 1, wherein the first sidewall electrode continuously extends vertically past a bottom of the interior cavity of the processing chamber and the top of the interior cavity.

11. The method of claim 1, wherein the first sidewall electrode has a ring shape as viewed in a top-view.

12. The method of claim 1, wherein the processing gas is introduced into the process chamber by way of a gas inlet that extends through the first sidewall electrode.

13. The method of claim 1, wherein the first sidewall electrode has a larger height than the interior cavity of the processing chamber.

14. A method for cleaning a processing chamber, the method comprising:
introducing a processing gas into the processing chamber, wherein an electrostatic chuck is disposed within the processing chamber and wherein the processing chamber has a cylindrical shaped sidewall;
connecting an electrode within the processing chamber to a first electric potential, wherein the electrostatic chuck and the electrode are electrically isolated from the cylindrical shaped sidewall of the processing chamber;
applying a bias voltage having a second negative electric potential to a cylindrical shaped electrode that is outside of the processing chamber and that surrounds the cylindrical shaped sidewall of the processing chamber processing chamber, wherein the first electric potential is ground and an absolute value of the second negative electric potential is larger than an absolute value of the first electric potential;
generating a plasma from the processing gas; and
evacuating the processing gas from the processing chamber after applying the bias voltage.

15. The method of claim 14, wherein the cylindrical shaped electrode vertically extends from below a bottom of an interior cavity of the processing chamber to above a top of the interior cavity.

16. The method of claim 14, wherein the cylindrical shaped electrode is a single continuous piece of conductive material having a cylindrical shape.

17. A method for cleaning a processing chamber, the method comprising:
introducing a processing gas into the processing chamber having a sidewall;
connecting an electrode within the processing chamber to a first electric potential, wherein an electrostatic chuck is disposed within the processing chamber over the electrode and has a surface configured to receive a workpiece, and wherein the electrostatic chuck and the electrode are electrically isolated from the one or more sidewall of the processing chamber;
applying a bias voltage having a second negative electric potential to a first sidewall electrode adjacent to the sidewall of the processing chamber and outside of the processing chamber, wherein the first electric potential is ground and the second negative electric potential has a larger magnitude than the first electric potential; and
generating a plasma from the processing gas inside the processing chamber, the plasma being configured to clean the processing chamber.

18. The method of claim 17, wherein the first sidewall electrode vertically extends from below a bottom of an interior cavity of the processing chamber to above a top of the interior cavity.

19. The method of claim 17,
wherein the processing gas is introduced into the process chamber by way of a gas inlet that extends between an upper surface and a lower surface of the first sidewall electrode.

20. The method of claim 17, wherein the first sidewall electrode has a larger height than an interior cavity of the processing chamber surrounding the electrostatic chuck.

* * * * *